United States Patent
Ragone et al.

(10) Patent No.: US 11,139,811 B2
(45) Date of Patent: Oct. 5, 2021

(54) DRIVER CIRCUIT, CORRESPONDING DEVICE AND SYSTEM

(71) Applicant: STMicroelectronics S.r.l., Agrate Brianza (IT)

(72) Inventors: Giancarlo Ragone, Roccella Jonica (IT); Vanni Poletto, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/854,518

(22) Filed: Apr. 21, 2020

(65) Prior Publication Data
US 2020/0350902 A1  Nov. 5, 2020

(30) Foreign Application Priority Data

Apr. 30, 2019  (IT) .......................... 102019000006457

(51) Int. Cl.
| | |
|---|---|
| *H03K 17/08* | (2006.01) |
| *H03K 17/082* | (2006.01) |
| *B60R 21/017* | (2006.01) |
| *B60R 21/01* | (2006.01) |
| *H03F 3/45* | (2006.01) |

(52) U.S. Cl.
CPC ....... *H03K 17/0822* (2013.01); *B60R 21/017* (2013.01); *B60R 2021/01286* (2013.01); *H03F 3/45* (2013.01)

(58) Field of Classification Search
CPC .............. H03K 17/0822; B60R 21/017; B60R 2021/01286; H03F 3/45; H03F 1/0205; H03F 3/45179

USPC .......................................................... 307/9.1
See application file for complete search history.

(56) References Cited

U.S. PATENT DOCUMENTS

| | | | | |
|---|---|---|---|---|
| 5,748,422 A | * | 5/1998 | Heaston | H02H 3/202 361/101 |
| 10,199,932 B1 | * | 2/2019 | Hastings | G05F 1/468 |
| 10,571,943 B2 | * | 2/2020 | Poletto | H03K 17/687 |
| 2003/0087615 A1 | * | 5/2003 | Randall | H01Q 1/2233 455/127.1 |

(Continued)

FOREIGN PATENT DOCUMENTS

| | | |
|---|---|---|
| EP | 1985506 A2 | 10/2008 |
| WO | 2017207242 A1 | 12/2017 |

*Primary Examiner* — Ryan Jager
(74) *Attorney, Agent, or Firm* — Seed IP Law Group LLP

(57) ABSTRACT

A drive circuit for airbag systems, for instance includes a differential transconductance amplifier having a first input node, a second input node, an output node coupled to the second input node via a feedback line; a transistor coupled between a drive node and a supply node configured to be coupled to a power supply source; a control node coupled to the control electrode of the transistor and the output node; a Zener diode arrangement having cathode and anode terminals coupled to the supply node and the first input node, respectively; a pull-up component arranged in parallel with the Zener diode arrangement; and an enable switch coupled to the first input node and referred to ground and switchable between a conductive state and a non-conductive state with the differential transconductance amplifier providing controlled current discharging/charging of the control node to make the transistor conductive/non-conductive, respectively.

22 Claims, 3 Drawing Sheets

(56) References Cited

U.S. PATENT DOCUMENTS

| | | | |
|---|---|---|---|
| 2010/0079649 A1* | 4/2010 | Ayraud | H04N 5/3698 348/308 |
| 2010/0257383 A1* | 10/2010 | Chiu | G05F 1/575 713/300 |
| 2015/0145583 A1 | 5/2015 | Hayashi | |
| 2015/0318691 A2 | 11/2015 | Easwaran | |
| 2018/0017601 A1 | 1/2018 | Easwaran et al. | |
| 2019/0161043 A1 | 5/2019 | Schumacher | |

* cited by examiner

DRIVER CIRCUIT, CORRESPONDING DEVICE AND SYSTEM

BACKGROUND

Technical Field

The description relates to driver circuits. One or more embodiments may be applied, for instance, to controlling power transistors such as power p-type metal-oxide-semiconductor logic (PMOS) transistors.

Description of the Related Art

Power transistors are currently used in a wide variety of devices such as, for instance, "smart" power devices in the automotive sector.

Squib driver devices for airbag systems may be exemplary of such devices.

The designation "squib" is a designation currently adopted in the automotive sector to indicate a component in an airbag inflator to spark the airbag deployment process.

In certain applications, a squib may be configured to generate an error code indicative of the desirability of replacing the associated airbag.

BRIEF SUMMARY

Despite the extensive activity in that sector, driver circuits capable of reducing electro-magnetic emissions (EMI), by reducing current peaks, for instance, and increasing the degree of safety of the associated device are desirable.

An object of one or more embodiments is to contribute in providing such an improved circuit.

According to one or more embodiments, that object can be achieved by means of a circuit having the features set forth in the claims that follow.

One or more embodiments may relate to a corresponding device, such as a combination of the circuit of one or more embodiments and (power) transistor driven thereby, for instance.

One or more embodiments may relate to a corresponding system. An airbag system including a squib driver according to embodiments may be exemplary of such a system.

The claims are an integral part of the technical teaching provided in respect of one or more embodiments.

A circuit according to embodiments may be used advantageously as a switch configured to control supply of a transistor-based arrangement such as squib driver.

One or more embodiments may facilitate controlling an external PMOS transistor and/or limiting current peaks and, consequently, electromagnetic emissions.

One or more embodiments may facilitate avoiding an undesired transistor turn-on (in the absence of certain faults being detected, for instance), which may result in improved safety.

One or more embodiments may take into account the fact that driving an external PMOS transistor can be advantageous in comparison with driving an external MOS transistor of the n-type (NMOS): turning-on this latter type of transistor may involve a higher voltage applied to the control terminal (gate, in the case of a field-effect transistor such as a MOS transistor), which may render the overall arrangement more complex while also increasing the semiconductor area occupied.

One or more embodiments may employ a single-stage operational transconductance amplifier (OTA) with unitary total gain (buffer-like operation). Such an arrangement may involve a voltage limited via clamping the gate-source voltage (VGs) while also possibly providing current limitation in the case of a short-circuit condition towards ground or the high voltage (HV) node.

One or more embodiments may provide a high-voltage driver for driving and external transistor (PMOS, for instance). The so-called "3rd" FET in a squib driver may be exemplary of such an application.

More generally, one or more embodiments may be applied to "smart" power applications, a squib driver being just one example of a wide variety of possible applications.

One or more embodiments may involve one or more of the following features:

- p-gate voltage control with charging or discharging processes under controlled current conditions;
- current self-limitation in the case of short-circuit towards ground (GND) or a high voltage (HV) node;
- limiting the gate-source voltage (VGs) of the input stage;
- voltage clamp via a chain of Zener diodes;
- capability of turning-off an external power transistor (PMOS, for instance) via a pull-up resistor or switch;
- limitation of current peaks during turn-on and turn-off phases; and
- unitary gain.

BRIEF DESCRIPTION OF THE SEVERAL VIEWS OF THE DRAWINGS

One of more embodiments will now be described, by way of example only, with reference to the annexed figures, wherein.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
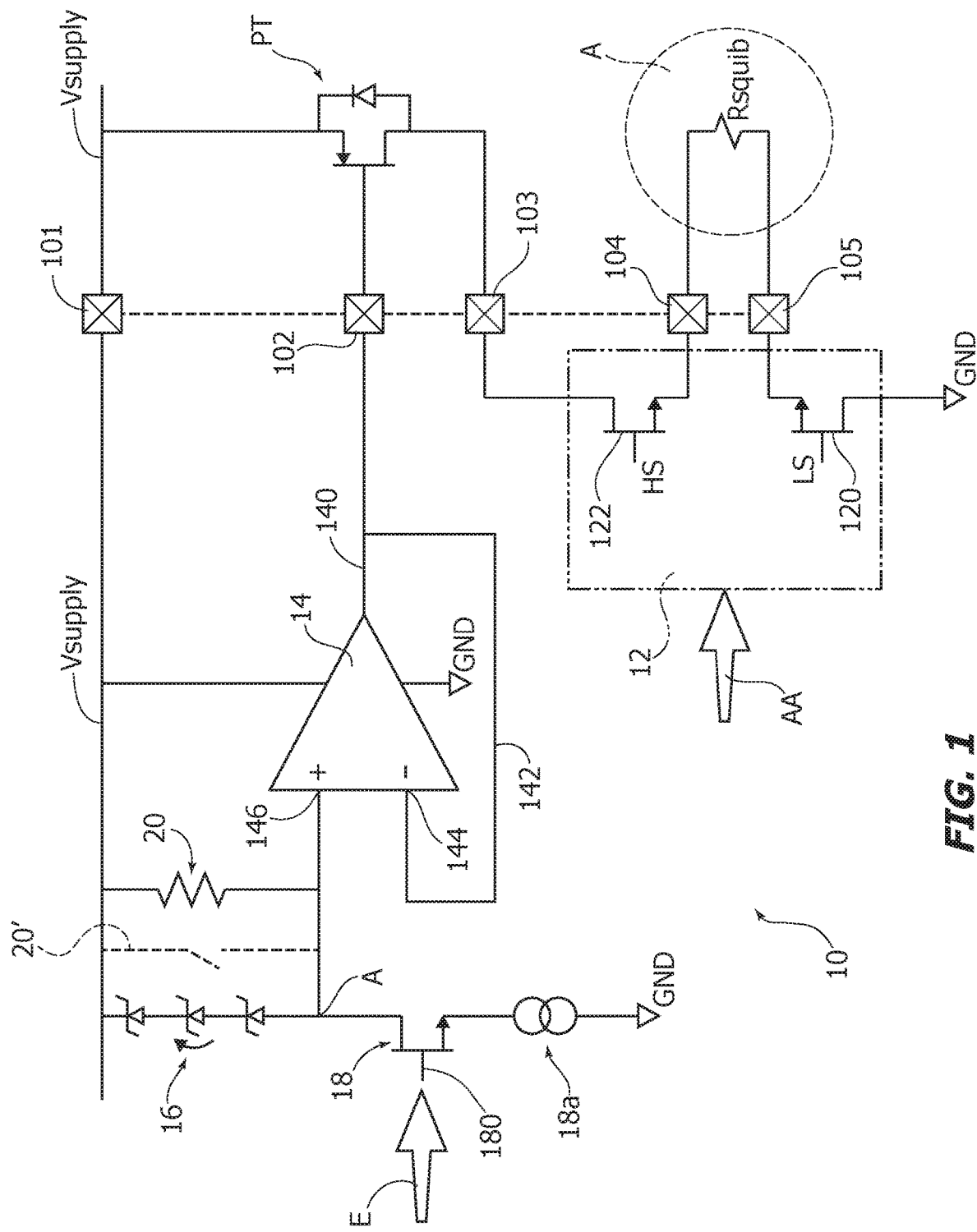
FIG. 1 is a circuit diagram exemplary of embodiments illustrated together with external components possibly associated therewith.

In FIG. 1, reference 10 denotes as a whole a driver circuit configured to operate with certain "external" components, that is devices which may distinct from the embodiments.

For instance, such external components may comprise a (power) transistor PT and load A. In one or more embodiments, the load A may comprise a so-called squib (exemplified as a resistor Rsquib) in an airbag system.

As noted, "squib" is a common designation of a component within an airbag configured to begin the airbag deployment process (and possibly generate an error code indicating replacing the airbag being desirable).

In that case, the transistor PT may be a so-called "third" transistor (a field-effect transistor such as MOS transistor like a PMOS transistor, for instance) included in such an airbag system. The designation "third" transistor ($3^{rd}$ FET) takes into account that in such a possible application, the circuit 10 may include squib driver circuitry 12 in turn comprising "first" and "second" transistors 120, 122 acting as low-side (LS) and high-side (HS) transistors in driving the load A.

In one or more embodiments, the first and second transistors 120, 122 may again comprise field-effect transistors such as NMOS transistors.

In one or more embodiments as exemplified in FIG. 1, the circuit 10 may comprise a set of pins 101 to 105 such as:
- 101: a VMAIN pin configured to facilitate sharing of a supply voltage (23.5 V, for instance) over a supply rail Vsupply by the circuit 10 and the power transistor PT (for instance by being coupled to the source thereof);
- 102: a SO pin configured to drive the control terminal of the power transistor PT (the gate in the case of a field-effect transistor such as PMOS transistor);
- 103: a SS pin configured to couple the current path (source-drain in the case of the field-effect transistors such as MOSFET transistors) through the power transistor PT with a current flow line towards ground GND provided by the (e.g., squib) drive circuitry 12 comprising the first and second transistors 120, 122; as exemplified herein this may occur by coupling the current path through the power transistor PT (at the drain, for instance) with the current path through the second transistor 122 (at the drain, for instance);
- 104: a HSO (high-side) pin configured to couple the current path through the second, high side of transistor 122 (at the side thereof opposite the SS pin 103, at the source, for instance) with a first input node of the load A; and
- 105: a LSO (low-side) pin configured to couple the current path (the drain, for instance) through the first, low-side transistor 120 to a second input node of the load A with the current path through the transistor 120 referred to ground GND on the side thereof opposite the LSO pin 105 (at the source, for instance).

As exemplified in FIG. 1, the circuit 10 comprises a differential stage such as an operational transconductance amplifier (OTA) 14 having an output node 140 coupled to the pin 102—and thus configured to be coupled with the control terminal of the power transistor PT—and a (negative) feedback line 142 coupling the output node 140 to one of the inputs (the inverting input 144, for instance) of the OTA 14.

As exemplified herein, supply of the OTA 14 is provided by the OTA being coupled between ground GND and the supply rail Vsupply (at 23.5 V, for instance) coming down to the pin 101.

As exemplified in FIG. 1, the other (non-inverting, for instance) input 146 of the OTA 14 is configured to have applied thereto a clamp voltage Vclamp provided at a node A via set of N Zener diodes indicated collectively as 16.

As exemplified in FIG. 1, the set of Zener diodes are arranged in a cascaded arrangement where the Zener diodes have their cathodes towards the supply line or rail Vsupply and their anodes towards the node A.

Reference 18 denotes an electronic switch (a transistor such as MOSFET transistor, for instance) arranged with the current path through the switch (namely the source-drain channel in case the switch is implemented via field-effect transistor) coupled between the node A and ground GND and configured (in a manner known to those of skill in the art) to act as a current generator as exemplified at 18a.

Finally, reference 20 denotes a pull-up component—such as a resistor, for instance—arranged between the supply rail Vsupply and the node A (that is the non-inverting input 146 of the OTA 14, in an arrangement as exemplified herein).

In an arrangement as exemplified in FIG. 1, as a result of the Zener diode set 16 being reverse-biased, the node A (and thus the non-inverting input 146 of the OTA 14) can be brought to a voltage Vclamp equal to the difference between the voltage at the supply line Vsupply and the Zener voltage drop across the Zener diodes 16 which.

In the case of N Zener diodes having a same Zener voltage Vzener the relationship $$V\text{clamp} = V\text{supply} - N * V\text{zener}$$

will apply under these circumstances.

Operation of an arrangement as exemplified in FIG. 1 may involve applying (by means known to those of skill in the art, not visible in FIG. 1) an enable signal E to the control electrode 180 (gate, in the case of a field-effect transistor implementation) of the switch 18 to make the switch conductive.

As a result of the switch/MOSFET 18 being made conductive, the Zener diodes 16 will be (reverse) biased by the current generator 18a so that the voltage Vclamp is applied to the (non-inverting) input 146 of the OTA 14.

Such voltage will be transferred (essentially at about the same value) to the output node 140 of the OTA 14, which will be discharged—under controlled current conditions, due to 14 being an OTA—causing the (external) transistor PT to be turned-on (made conductive).

In that way, the supply voltage at the rail Vsupply (made available to the power transistor PT via the pin 101) will be applied to the squib driver circuitry 12.

The possibility will thus exist of activating the transistors 120, 122 (via an activation signal AA produced in a manner known to those of skill in the art, according to desired operation specifications) to supply (power-up) the load A as desired.

In the exemplary case of the application to an airbag system, the signal AA may be an airbag activation signal AA generated (in a manner known per se, for instance, by a deceleration/impact detection system in a vehicle—not visible in the figures) to spark the airbag deployment process.

Discontinuing enablement of the switch/MOSFET 18 (for instance by bringing to "low" an enable signal previously to "high") will cause the switch/MOSFET to become non-conductive and the inverting input 146 of the OTA 14 to be "pulled-up" to the voltage of the supply rail Vsupply via the component 20. The voltage at the output node 140 will thus be gradually brought (by being charged—under controlled current conditions, due to 14 being an OTA) to the voltage at the supply rail Vsupply, with the (external) power transistor PT turned-off (made non-conductive).

In embodiments as exemplified herein, the Zener voltage across the Zener diode arrangement 16 can be selected (by selecting the number N of cascaded Zener diodes, for instance) as a function of a desired overdrive value for activating the (external) transistor PT as a function of desired application specifications.

In one or more embodiments, the pull-up resistor 20 can be replaced by a controlled switch (as shown in dashed lines at 20') in order to reduce turn-off time.

Figure 2:
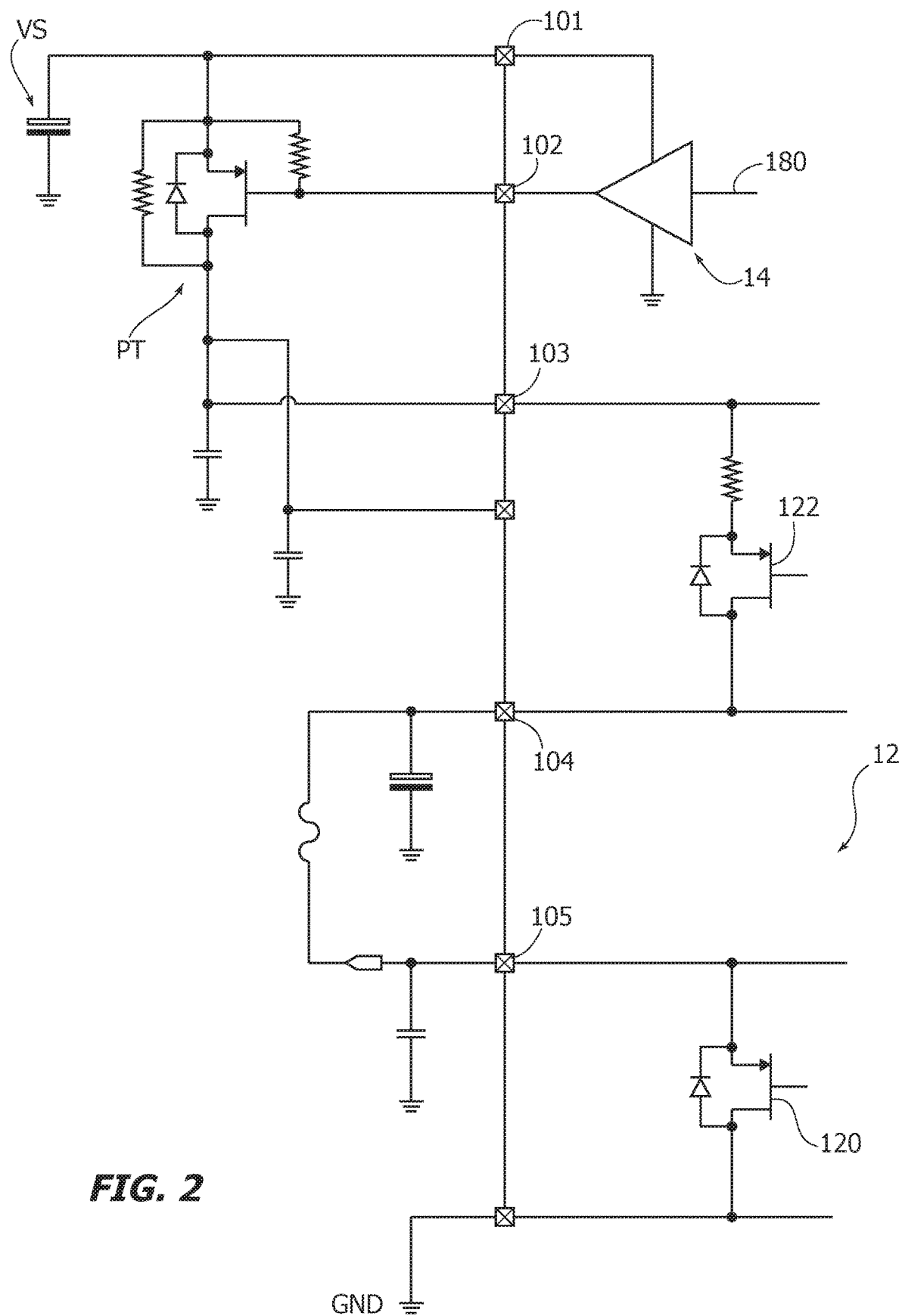
FIG. 2 is a circuit diagram exemplary of the possible application of embodiments to squib driver arrangement.
Figure 3:
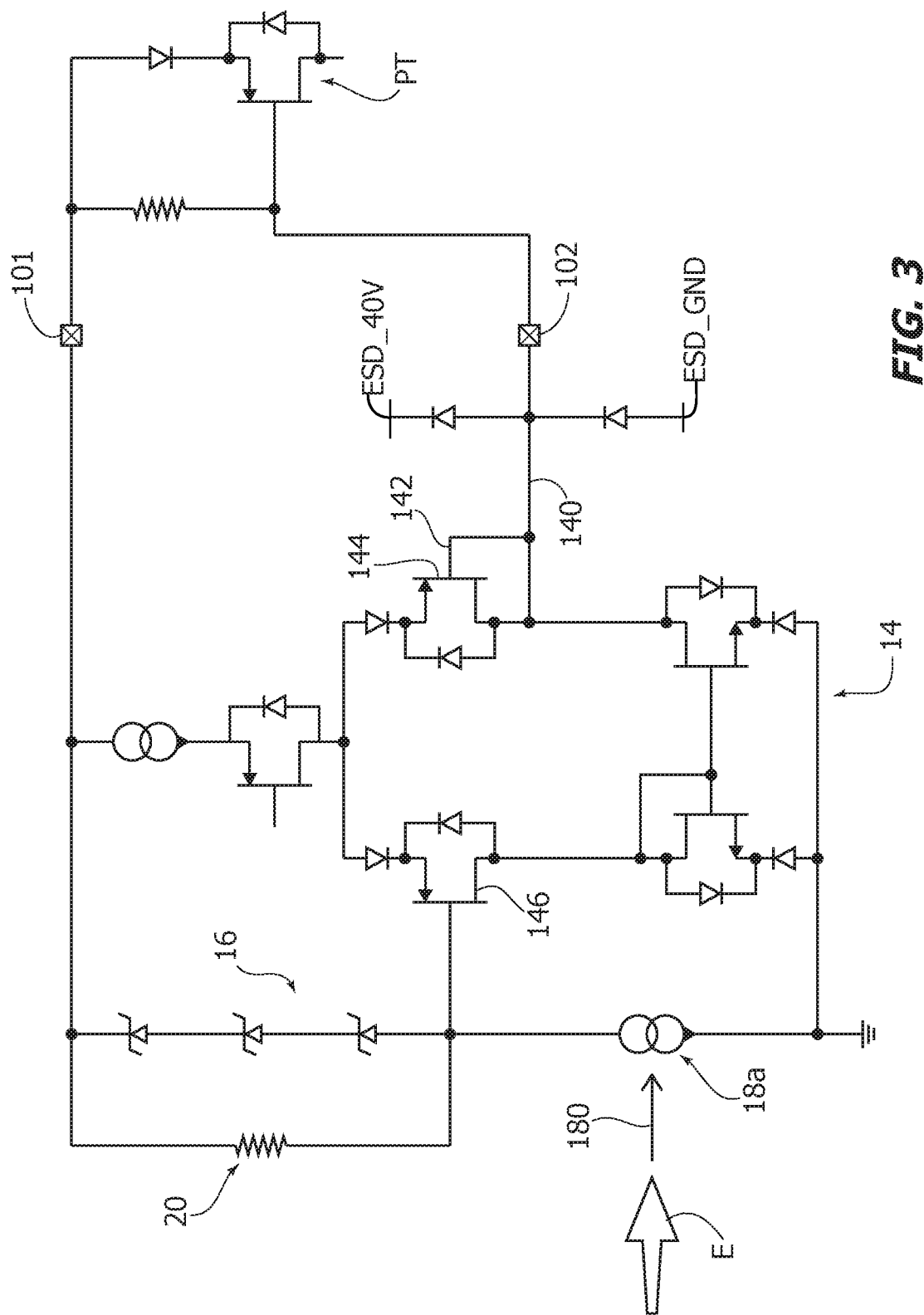
FIG. 3 is a further circuit representation useful in understanding operation of embodiments.

In FIGS. 2 and 3, parts or elements like parts or elements already discussed in connection with FIG. 1 are indicated with like reference symbols, so that the detailed description will not be repeated for brevity.

FIGS. 2 and 3 illustrate certain "real-word" details of circuitry as exemplified in FIG. 1, by showing parasitic components (capacitances, for instance) as well as a supply source VS (a battery in a vehicle, for instance) coupled to the supply rail Vsupply/the supply pin 101 to provide a supply voltage (23.5 V, for instance) thereto.

The transistor-level representation in FIG. 3 further details certain components of the OTA 14 by highlighting the presence of the (negative) feedback path 142 from the output node 140 towards the (inverting) input 144. Those of skill in the art will otherwise easily appreciate that different circuit configuration may be adopted for these purpose (an inverted OTA output applied to the OTA non-inverting input, for instance).

Merely for the sake of completeness, FIG. 3 exemplifies the possible prevision of diodes which facilitate protection of the circuitry coming down to the pin 102 from electrostatic discharge phenomena (currently referred to as ESD—ElectroStatic Discharge). Such phenomena may occur, for instance, when handling the chip.

As exemplified herein, the two ESD protection diodes are arranged:
  the first one with the anode coupled to the output 140 of the OTA (pin 102) and the cathode coupled to a node ESD_40V: this is a rail connected to a central clamp which is self-ignited when the voltage reaches during discharge, a value of, e.g., 40V, so that an "alternative" discharge path is activated through the diode; and
  the second one with the cathode coupled to the output 140 of the OTA (pin 102) and the anode coupled to ground as indicated by ESD_GND: the diode connected to ESD_GND is activated in the event that a discharge causes the pin 102 to go below ground level.

A circuit (for instance, 10) as exemplified herein, may comprise:
  a differential transconductance amplifier (OTA, for instance, 14) having a first input node (for instance, 146), a second input node (for instance, 144), an output node (for instance, 140), the output node coupled to the second input node via a feedback line (for instance, 142);
  a supply node (for instance, 101) and a drive node (for instance, 103) configured to be coupled to the current path through a transistor (for instance, PT, optionally a field-effect transistor such as a MOSFET transistor, like a PMOS) with said transistor intermediate the supply node and the drive node, the supply node configured to be coupled to a power supply source (for instance, VS at a voltage Vsupply);
  a control node (for instance, 102) configured to be coupled to the control electrode of said transistor (the gate, in case of a field-effect transistor such as a MOSFET), the control node coupled to the output node of the differential transconductance amplifier;
  a Zener diode arrangement (for instance, 16) having cathode and anode terminals coupled to the supply node and the first input node of the differential transconductance amplifier;
  a pull-up component (for instance, 20, 20') arranged in parallel to the Zener diode arrangement; and
  an enable switch (for instance, 18) coupled to the first input node of the differential transconductance amplifier, the enable switch referred to ground and switchable (see, for instance, E) between:
    i) a conductive state, with the first input node of the differential transconductance amplifier coupled to the supply node via the reverse-biased Zener diode arrangement, and the differential transconductance amplifier providing controlled current discharging of the control node coupled to the output node of the differential transconductance amplifier to make said transistor conductive; and
    ii) a non-conductive state, with the first input node of the differential circuit stage pulled up to the (voltage of the) supply node via the pull-up component and the differential transconductance amplifier providing controlled current charging of the control node coupled to the output node of the differential transconductance amplifier to make said transistor non-conductive.

In a circuit as exemplified herein, the output node and the second input node of the differential transconductance amplifier may be coupled via a negative feedback line.

In a circuit as exemplified herein, the Zener diode arrangement may comprise a series arrangement of N Zener diodes having their cathodes and anodes facing towards the supply node and towards the first input node of the differential transconductance amplifier, respectively.

In a circuit as exemplified herein wherein the pull-up component may comprise one of a pull-up resistor (for instance, 20) and a pull-up switch (for instance, 20'), the pull-up switch configured to be made conductive to couple the first input node of the differential circuit stage to the supply node.

In a circuit as exemplified herein, the enable switch may comprise a transistor having the current path therethrough (source-drain in the case of a field-effect transistor such a MOSFET) configured to provide a current flow line (for instance, 18a) between the Zener diode arrangement and ground.

A circuit as exemplified herein may comprise load drive circuitry (for instance, 12, 120, 122) intermediate said drive node and ground, said load drive circuitry activatable (for instance, AA) as a result of said drive node being coupled to said supply node via said transistor made conductive with said enable switch in said conductive state.

In a circuit as exemplified herein, said load drive circuitry may comprises:
  first (for instance, 104) and second (for instance, 105) output nodes configured to be coupled to a load (for instance, A); and
  a pair of transistors (for instance, 120, 122) arranged the one (for instance, 122) intermediate said drive node and said first output node, and the other (for instance, 120) intermediate said second output node and ground.

A device as exemplified herein may comprise:
  the circuit as exemplified herein; and
  said transistor arranged with the current path therethrough coupling said supply node and said drive node.

A system, as exemplified herein may comprise:
  a device according as exemplified herein; and a load (for instance, A) coupled to (across) said first and second output nodes.

In a system as exemplified herein, said load coupled to said first and second output nodes comprises an activation component (a "squib", for instance) of a vehicle airbag.

Without prejudice to the underlying principles, the details and embodiments may vary with respect to what has been described by way of example only without departing from the scope of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a differential transconductance amplifier having a first input node, a second input node, and an output node, the output node being coupled to the second input node via a feedback line;
   a supply node and a drive node configured to be coupled to a transistor operative to provide a current path between the supply node and the drive node, the supply node being configured to be coupled to a power supply source;
   a control node coupled to the output node of the differential transconductance amplifier and a control terminal of the transistor;
   a Zener diode arrangement having a cathode coupled to the supply node and an anode coupled to the first input node of the differential transconductance amplifier;
   a pull-up component coupled in parallel with the Zener diode arrangement; and
   an enable switch having a first terminal coupled to the first input node and a second terminal coupled to a ground node, the enable switch being switchable between:
      a conductive state during which the first input node is coupled to the supply node via the Zener diode arrangement in a reverse-bias configuration, and the differential transconductance amplifier performs controlled current discharging of the control node rendering the transistor conductive; and
      a non-conductive state during which the first input node is pulled up to the supply node via the pull-up component, and the differential transconductance amplifier performs controlled current charging of the control node rendering the transistor non-conductive.

2. The circuit of claim 1, wherein the feedback line is a negative feedback line.

3. The circuit of claim 1, wherein the Zener diode arrangement includes a plurality of Zener diodes coupled in series and having the same polarity such that a first Zener diode of the plurality of Zener diodes has an anode coupled to the first input node, a last Zener diode of the plurality of Zener diodes has a cathode coupled to the supply node and one or more intervening Zener diodes of the plurality of Zener diodes are coupled between the first Zener diode and the last Zener diode and have the same polarity as the first and last Zener diodes.

4. The circuit of claim 1, wherein the pull-up component includes at least one of: a pull-up resistance, or a pull-up switch configured to be placed in a conductive state to couple the first input node to the supply node.

5. The circuit of claim 1, wherein the enable switch includes a switching transistor operative to have a current path therethrough that provides a current flow line between the Zener diode arrangement and the ground node.

6. The circuit of claim 1, comprising:
   load drive circuitry coupled between the drive node and the ground node, the load drive circuitry being operable to be activated in response to the enable switch being in the conductive state and the transistor being made conductive to couple the drive node to the supply node.

7. The circuit of claim 6, wherein the load drive circuitry includes:
   first and second output nodes configured to be coupled to a load; and
   a first transistor having a first conduction terminal coupled to the said drive node and a second conduction terminal coupled to the first output node, and a second transistor having a first conduction terminal coupled to the second output node and a second conduction terminal coupled to the ground node.

8. A device, comprising:
   a circuit including:
      a differential transconductance amplifier having a first input node, a second input node, and an output node, the output node being coupled to the second input node via a feedback line;
      a supply node and a drive node configured to be coupled to a transistor operative to provide a current path between the supply node and the drive node, the supply node being configured to be coupled to a power supply source;
      a control node coupled to the output node of the differential transconductance amplifier and a control terminal of the transistor;
      a Zener diode arrangement having a cathode coupled to the supply node and an anode coupled to the first input node of the differential transconductance amplifier;
      a pull-up component coupled in parallel with the Zener diode arrangement; and
      an enable switch having a first terminal coupled to the first input node and a second terminal coupled to a ground node, the enable switch being switchable between:
         a conductive state during which the first input node is coupled to the supply node via the Zener diode arrangement in a reverse-bias configuration, and the differential transconductance amplifier performs controlled current discharging of the control node rendering the transistor conductive; and
         a non-conductive state during which the first input node is pulled up to the supply node via the pull-up component, and the differential transconductance amplifier performs controlled current charging of the control node rendering the transistor non-conductive.

9. The device of claim 8, wherein the Zener diode arrangement includes a plurality of Zener diodes coupled in series and having the same polarity such that a first Zener diode of the plurality of Zener diodes has an anode coupled to the first input node, a last Zener diode of the plurality of Zener diodes has a cathode coupled to the supply node and one or more intervening Zener diodes of the plurality of Zener diodes are coupled between the first Zener diode and the last Zener diode and have the same polarity as the first and last Zener diodes.

10. The device of claim 8, wherein the pull-up component includes at least one of: a pull-up resistance, or a pull-up switch configured to be placed in a conductive state to couple the first input node to the supply node.

11. A system, comprising:
a circuit, including:
   a differential transconductance amplifier having a first input node, a second input node, and an output node, the output node being coupled to the second input node via a feedback line;
   a supply node configured to be coupled to a power supply source;
   a drive node;
   a transistor having a first conductive terminal coupled to the supply node, a second conductive terminal coupled to the drive node, and a control terminal, the transistor being operative to provide a current path between the supply node and the drive node;
   a control node coupled to the output node of the differential transconductance amplifier and the control terminal of the transistor;
   a Zener diode arrangement having a cathode coupled to the supply node and an anode coupled to the first input node of the differential transconductance amplifier;
   a pull-up component coupled in parallel with the Zener diode arrangement;
   an enable switch having a first terminal coupled to the first input node and a second terminal coupled to a ground node, the enable switch being switchable between:
      a conductive state during which the first input node is coupled to the supply node via the Zener diode arrangement in a reverse-bias configuration, and the differential transconductance amplifier performs controlled current discharging of the control node rendering the transistor conductive; and
      a non-conductive state during which the first input node is pulled up to the supply node via the pull-up component, and the differential transconductance amplifier performs controlled current charging of the control node rendering the transistor non-conductive;
load drive circuitry including:
   first and second circuit output nodes;
   first load transistor having a first conduction terminal coupled to said drive node and a second conduction terminal coupled to the first circuit output node, and a second load transistor having a first conduction terminal coupled to the second circuit output node and a second conduction terminal coupled to the ground node; and
   a load coupled to the first and second circuit output nodes.

12. The system of claim 11, wherein the load includes an activation component of a vehicle airbag.

13. The system of claim 11, wherein the feedback line is a negative feedback line.

14. The system of claim 11, wherein the Zener diode arrangement includes a plurality of Zener diodes coupled in series and having the same polarity such that a first Zener diode of the plurality of Zener diodes has an anode coupled to the first input node, a last Zener diode of the plurality of Zener diodes has a cathode coupled to the supply node and one or more intervening Zener diodes of the plurality of Zener diodes are coupled between the first Zener diode and the last Zener diode and have the same polarity as the first and last Zener diodes.

15. The system of claim 11, wherein the pull-up component includes at least one of: a pull-up resistance, or a pull-up switch configured to be placed in a conductive state to couple the first input node to the supply node.

16. The system of claim 11, wherein the enable switch includes a switching transistor operative to have a current path therethrough that provides a current flow line between the Zener diode arrangement and the ground node.

17. A method, comprising:
operating a switch to set a first voltage to either: a clamp voltage representative of a difference between a supply voltage and a voltage drop across a Zener diode arrangement, or a pull-up voltage to the supply voltage;
receiving, by a differential transconductance amplifier at a first input, the first voltage;
receiving, by the differential transconductance amplifier at a second input, a feedback voltage representative of an output voltage provided at an output of the differential transconductance amplifier;
comparing, by the differential transconductance amplifier, the first voltage to the feedback voltage; and
sinking or sourcing controlled current, by the differential transconductance amplifier at the output, to operate a transistor in a conductive state or non-conductive state based on the comparing.

18. The method of claim 17, wherein a feedback line between the output and the second input is a negative feedback line.

19. The method of claim 17, wherein the Zener diode arrangement includes a plurality of Zener diodes coupled in series and having the same polarity.

20. The method of claim 17, comprising:
pulling the pull-up voltage to the supply voltage by a pull-up component that includes at least one of: a pull-up resistance, or a pull-up switch.

21. The method of claim 20, comprising:
placing the pull-up switch in a conductive state to pull the first voltage to the supply voltage.

22. The method of claim 17, wherein the switch includes a switching transistor operative to have a current path therethrough that provides a current flow line between the zener diode arrangement and a ground node.

* * * * *